United States Patent [19]

Sawai et al.

[11] Patent Number: 5,057,026
[45] Date of Patent: Oct. 15, 1991

[54] ELECTRIC JUNCTION BOX

[75] Inventors: Mamoru Sawai; Mitsugu Watanabe; Hiroshi Suzuki; Keiichi Ozaki, all of Shizuoka, Japan

[73] Assignee: Yazaki Corporation, Japan

[21] Appl. No.: 480,975

[22] Filed: Feb. 16, 1990

[30] Foreign Application Priority Data

Feb. 16, 1989 [JP] Japan .................. 1-35100

[51] Int. Cl.$^5$ .............................. H01R 9/09
[52] U.S. Cl. ...................... 439/76; 439/43; 439/85; 439/507; 439/714; 439/721
[58] Field of Search ............ 439/43, 52, 76, 85, 439/94, 115, 119, 121, 507, 512-515, 714, 717, 721

[56] References Cited

U.S. PATENT DOCUMENTS

| | | | |
|---|---|---|---|
| 2,747,144 | 5/1956 | Beers | 439/43 |
| 2,884,613 | 4/1959 | Chandler, Jr. et al. | 439/721 |
| 2,986,621 | 5/1961 | Midgley | 439/714 |
| 3,005,180 | 10/1961 | Dreher | 439/714 |
| 3,432,796 | 3/1969 | Reimes | 439/85 |
| 4,021,093 | 5/1977 | Glaesel | 439/714 |
| 4,162,815 | 7/1979 | Fleischhacker | 339/19 |

*Primary Examiner*—Paula A. Bradley
*Attorney, Agent, or Firm*—Wigman & Cohen

[57] ABSTRACT

To standardize electric junction boxes so that the internal circuits can be applied to various requirements without markedly changing parts, the junction box is divided into plural stackable distributing units each connectable to each subharness via each subharness connector. The junction box comprises a plurality of stackable distributing units including a plurality of parallel arranged wires connectable with at least one external subharness; wire shorting bus bars or wire branch bars arranged so as to cross the parallel arranged wires; and an interlayer connecting unit or plural interlayer connecting terminals arranged so as to cross the surfaces of the plural distributing units for connecting the parallel arranged wires and the wire shorting bus bars arranged on different distributing units. Further, when male connector terminals are provided on each distributing unit, it is possible to form a subharness connector by use of these male connector terminals on each distributing unit.

18 Claims, 12 Drawing Sheets

ELECTRIC JUNCTION BOX

BACKGROUND OF THE INVENTION

1. Field of the Invention

The present invention relates to an electric junction box suitable for use in interconnections with wire harness.

2. Description of the Prior Art

Figure 1A:
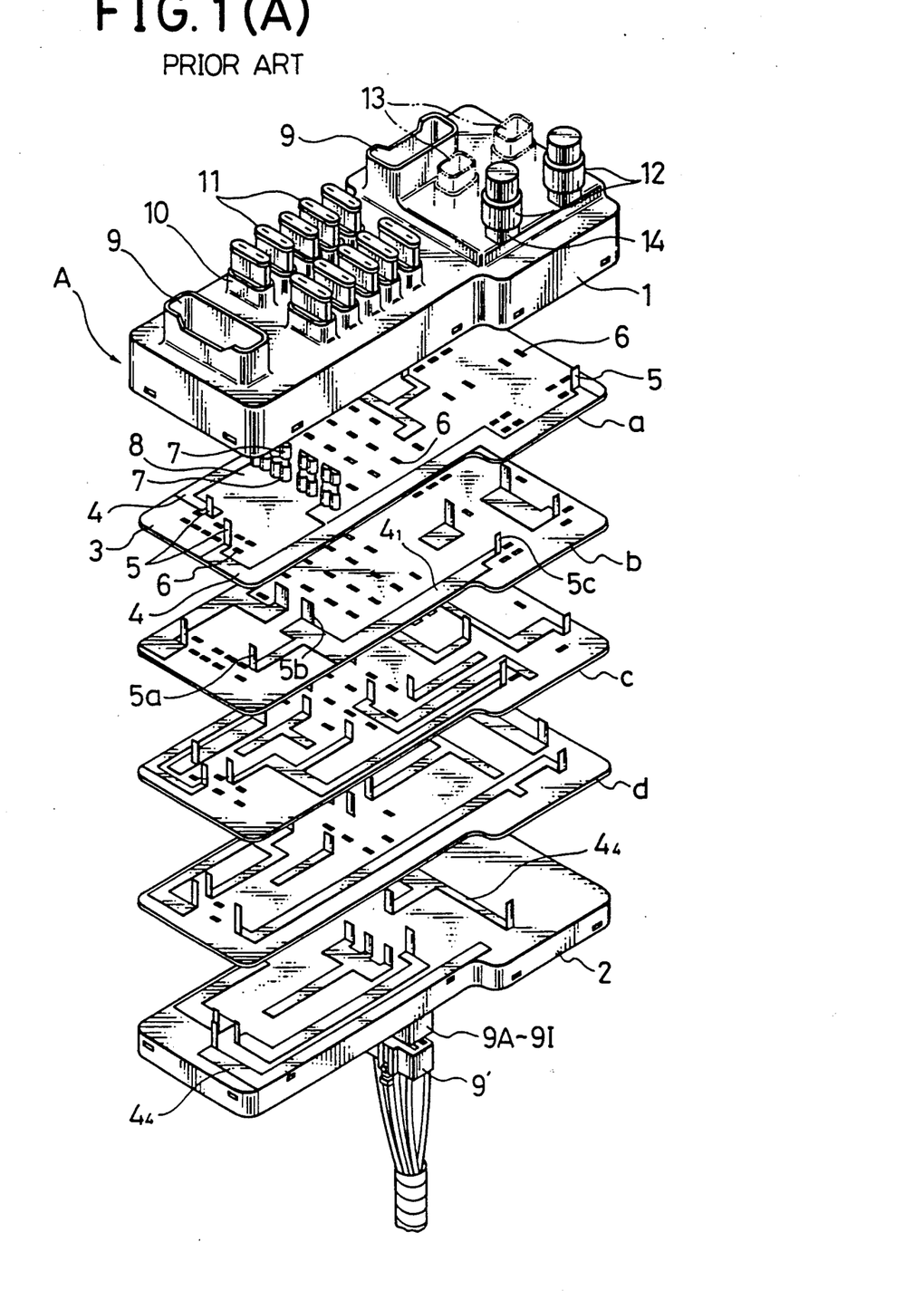
FIG. 1(A) is an exploded view showing an example of prior-art electric junction box A.

FIG. 1(A) shows an example of prior-art electric junction box A, which includes an upper box cover 1, a lower box cover 2, and a plurality of distributing boards a, b, . . . sandwiched between the upper and lower box covers 1 and 2 one over the other. Each distributing board is composed of an insulating board 3 on which a plurality of bus bars 4 are arranged. Each bus bar is formed with a plurality of angled (vertical) branch tabs 5. For instance, in the case of the second distributing board b, a bus bar $4_1$, is formed with three branch tabs 5a, 5b and 5c, in such a way as to constitute an electrode group together with other tabs of the other bus bars. For instance, the tab 5a extends to a connector housing 9; the tab 5b extends to a fuse cavity 10; and the tab 5c extends to a relay cavity 14. Further, in FIG. 1(A), each distributing board is formed with tab insertion holes 6 and intermediate junction terminals 7 having two female portions at both the ends thereof. The upper box cover 1 is provided with a number of fuses 11, relays 12, and circuit breakers 13.

Figure 1B:
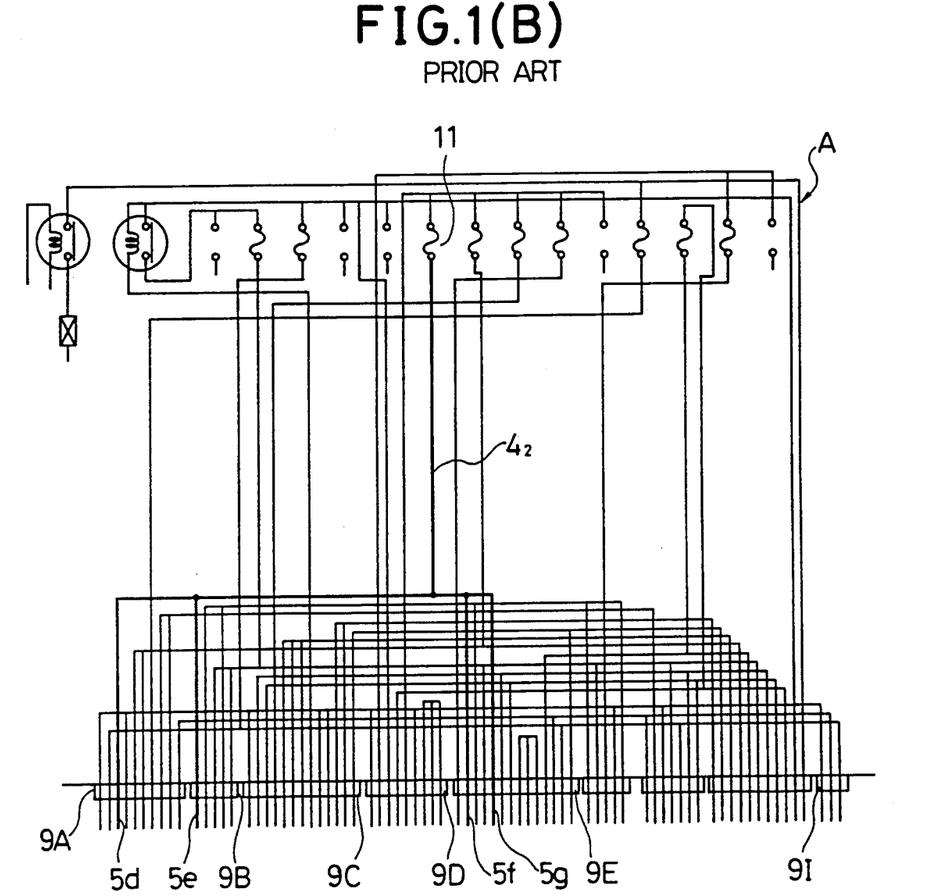
FIG. 1(B) is a wiring diagram of the internal circuit of the prior-art electric junction box shown in FIG. 1(A)

FIG. 1(B) is an internal circuit diagram of the prior-art electric junction box shown in FIG. 1(A). This diagram indicates that a bus bar $4_2$ (shown by thick lines) is branched into four tabs 5d, 5e, 5f and 5g on the load side (remote from the fuses), and the tab 5d extends to a lower connector 9A; the tab 5e extends to a lower connector 9B; the tabs 5f and 5g extends to a lower connector 9E. These lower connectors from connector 9A to 9I are connected to a plurality of subharness (not shown) extending from a wire harness via mated connectors 9', respectively.

In the prior-art electric junction box as described above, however, the internal circuits are separated by the bus bar circuits; that is, the bus bars 4 for each distributing board a, b . . . are formed by punching a thin metallic plate and then bending the punched bus bars. In other words, the prior-art junction box is composed of a plurality of different distributing boards. On the other hand, in general the wire harness is divided into a plurality of subharness, in order to simplify manufacturing process and wiring work.

Therefore, when the prior-art junction box is connected to a wire harness provided with subharness, these bus bars 4 ($4_1, 4_2, \ldots$) formed on each distributing board a, b, . . . must be arranged so as to be mated with the connectors 9 (9A, 9B, . . . ). Therefore, various problems arise in the prior-art junction box constructed by bus bars as follows:

(1) Since each tab 5 must be extended to the lower connector 9A-9I after having passed through each tab insertion hole 6, formed in the distributing board there exists broad wasteful areas where bus bars 4 cannot be arranged on each insulating board 3, so that the degree of freedom of wiring or arranging bus bars on each distributing board is markedly reduced.

(2) Since each bus bar 4 must be arranged so as not to be brought into contact with other bus bars 4 on the same distributing board, the circuit pattern of the bus bars is complicated and specialized according to the kinds of the junction boxes. That is, parts are difficult to be standardized so as to be applicable to various requirements for various degrees of products, for instance to various models of automotive vehicles.

(3) Therefore, it is difficult to modify the internal circuit of the junction box, and therefore many circuits are wastefully used according to the necessity.

SUMMARY OF THE INVENTION

With these problems in mind, therefore, it is the primary object of the present invention to provide an electric junction box, which can be applied to various internal circuits according to the requirements of products without markedly alternating parts; that is, by which the electric junction box can be standardized for various internal circuits within the junction box.

To achieve the above-mentioned object, the electric junction box according to the present invention comprises: (a) a plurality of stackable distributing units (20), each distributing unit ($21_1, 21_2 \ldots$) including a plurality of parallel arranged wires (22) connectable with at least one external subharness; (b) wire shorting means (23) arranged on each of the distributing unit, respectively so as to cross the parallel arranged wires, each wire shorting means being connected at least one of the parallel arranged wires arranged on the same distributing unit; and (c) interlayer connecting means (28, 33, 36, 37) arranged so as to cross surfaces of the plural distributing units, for connecting the wires and said wire shorting means arranged on different distributing units.

The wire shorting means is a wire shorting bus bar (23) having a strip-shaped conductive shorting element formed with at least one contact tab (23a, 23b) at least one end thereof and at least one wire receiving portion (23c) formed with a wire receiving slot (23d). In this embodiment, the interlayer connecting means is an interlayer connecting unit (28) including plural U-shaped section semicylindrical shorting bars (30) each formed with plural tab insertion slits (30a) and housed within an insulating housing (29).

Further, it is also possible to adopt interlayer connecting terminals (33, 34) passed through holes formed in the distributing units or other interlayer connecting terminals (36) together with vertical shorting bars (37). In these embodiments, the wire shorting means is preferably wire branch bars (38) formed with a plurality of wire receiving open slots (38a), for directly shorting the wires arranged on the same distributing unit (21).

One of the features of the electric junction box according to the present invention is to divide the junction box into plural stackable layer-built distributing units (20) so that each distributing unit can be connected to each subharness via at least one subharness connector mounted on each distributing unit. For the purpose, the electric junction box according to the present invention further comprises at least one male connector terminal (48) formed with at least one wire receiving slot and at least one tab portion extending perpendicular to the surface of said distributing unit so as to constitute a male contact terminal of the harness connector (39). Therefore, the harness connectors (39) are arranged on the distributing units, respectively to connect parallel arranged wires arranged on the same distributing unit with the external subharness. The harness connectors are mounted on the distributing units preferably in tiers fashion.

In addition, it is also possible to mount fuse boxes, relays, etc. on any required distributing units.

BRIEF DESCRIPTION OF THE DRAWINGS

The features and advantages of the electric junction box according to the present invention will be more clearly appreciated from the following description taken in conjunction with the accompanying drawings in which:

FIG. 2(C)-1 a perspective view showing a first modification of interlayer connecting units incorporated in the first embodiment shown in FIG. 2(A);

FIG. 2(C)-2 is a perspective view showing a second modification of the interlayer connecting units;

FIG. 2(C)-3 is a perspective view showing a third modification thereof;

FIG. 2(C)-4 is a perspective view showing a fourth modification thereof;

FIG. 2(C)-5 is a perspective view showing a fifth modification thereof;

DETAILED DESCRIPTION OF THE PREFERRED EMBODIMENTS

Embodiments of the electric junction box according to the present invention will be described hereinbelow with reference to the attached drawings.

FIG. 2(A) to (C)-5 show a first embodiment of the electric junction box B of the present invention, which roughly comprises a distributing unit assembly 20 and an interlayer connecting unit 28. Further, the distributing unit assembly 20 is composed of a plurality of stackable distributing units 21, a number of wires 22, and a number of wire shorting bus bars 23, and 23'.

Figure 2A:
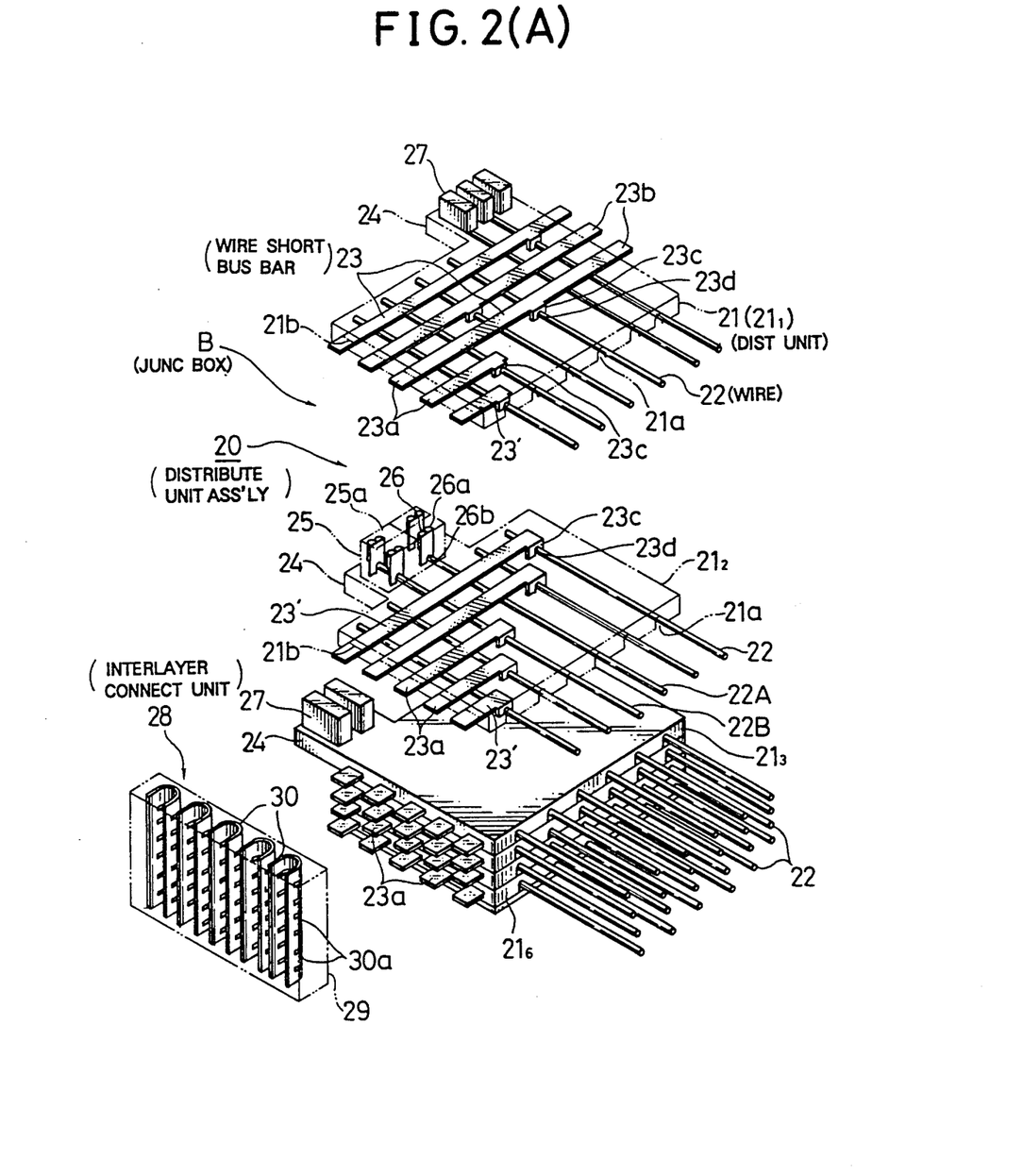
FIG. 2(A) is an exploded view showing the essential portions of a first embodiment of the electric junction box B according to the present invention.

In the first embodiment shown in FIG. 2(A) six distributing units ($21_1$, $21_2$—$21_6$) are stacked, where each suffix indicates each distributing unit beginning from the uppermost position to the lowermost position. On each distributing unit 21, a plurality of wires 22 constituting a subharness as a connector unit are arranged at regular intervals in parallel to each other on each distributing unit.

The distributing unit 21 is of a thin board formed with a plurality of wire guide grooves 21a arranged at regular intervals along a first side end wall thereof and further with a plurality of tab insertion holes 21b also arranged at regular intervals along one or two second side end walls perpendicular to the first side end wall.

The wire shorting bus bar 23 arranged on the first distributing unit $21_1$ is of strip-shaped conductive shorting element formed with contact tab terminals 23a and 23b at both ends thereof and a wire contact portion 23c formed with a wire receiving open slot 23d at an intermediate portion of the wire shorting bus bar 23.

On the other hand, the wire shorting bus bar 23' arranged on the first and second distributing units 21 is formed with a contact tab terminal 23a at one end thereof and a wire contact portion 23c at the other end thereof.

These wire shorting bus bars 23 and 23' are passed through tab insertion holes 21b formed in the first distributing unit $21_1$, in such a way that the contact tab terminal 23a projects from one end wall and the contact tab terminal 23b projects from the other end wall by a predetermined length, respectively, and thereafter fixed to the distributing unit $21_1$.

Under these conditions, a plurality of wires 22 are inserted into the distributing unit, $21_1$ so as to be pressure connected with the open slots 23d of the wire receiving portion 23c of the wire shorting bus bars 23 and 23', and thereafter pushed into the electric wire guide grooves 21a of the distributing unit 21 to temporarily fix the wires to the distributing unit 21.

In the case of the second distributing unit $21_2$, wire shorting bus bars 23' having different lengths are arranged by way of example. In the same way as described above, the two kinds of wire shorting bus bars 23 or 23' are arranged in parallel to each other on each of other distributing units $21_3$—$21_6$.

As shown in FIG. 2(A), a projecting board portion 24 is formed so as to project from one side wall of the second distributing unit $21_2$, and a relay connector 25 is provided on this board projecting portion 24 so that relay contact terminals 26 can be fitted into a terminal accommodating housing 25a of the relay connector 25. Each relay contact terminal 26 is formed with a female terminal end 26a on the upper side and a pressure contact end 26b with a lower wire receiving open slot 26b on the lower side so that the wire 22A or 22B can be pressure connected and fixed to the relay contact terminal 26. Therefore, it is possible to insert a relay (not shown) so as to be connected between the two adjacent relay contact terminals 26 or between the two adjacent wires 22A and 22B. In other words, the projecting board portion 24 can be used to mount a relay on the second distributing unit $21_2$.

In the same way, another projecting board portion 24 is formed so as to project from one side wall of the first and third distributing units 21₁ and 21₃, and also a fuse contact terminal connected to the wire 22 is provided for this projecting board portion 24, so that a fuse 27 can be inserted and connected to the wires 22. As described above, it is possible to form the projecting board portions 24, where necessary, so that relays or fuses can be mounted on each distributing unit in connection with predetermined wires 22.

As described above, the stackable distributing unit 20 can be formed by stacking a plurality of distributing units 21 one upon the other, on each of which the wires 22, the wire shorting bus bars 23 or 23', and fuse/relay contact terminals 26 are arranged with predetermined spaces between the two of these elements.

A first embodiment A of the electric junction box according to the present invention can be assembled by connecting an interlayer connecting unit 28 with a group of tabs 23a projecting from one side end surface of the distributing unit assembly 20 composed of plural stackable distributing units 21.

The interlayer connecting unit 28 is composed of a plurality of U-shaped section semicylindrical conductive shorting bars 30 arranged vertically at regular intervals within an insulating housing 29. Each shorting bar 30 is formed with a plurality of U-shaped tab insertion slits 30a arranged vertically to each of which each tab 23a of the strip-shaped conductive shorting bus bar 23 is pressure fitted. Therefore, when the contact tab terminals 23a of the distributing unit 20 are pressure fitted into the tab insertion slits 30a of the semicylindrical conductive shorting bars 30, since wires or circuits formed on each stackable distributing units 21₁, 21₂, —21₆ are connected to each other to form branch circuits.

Figure 2B:
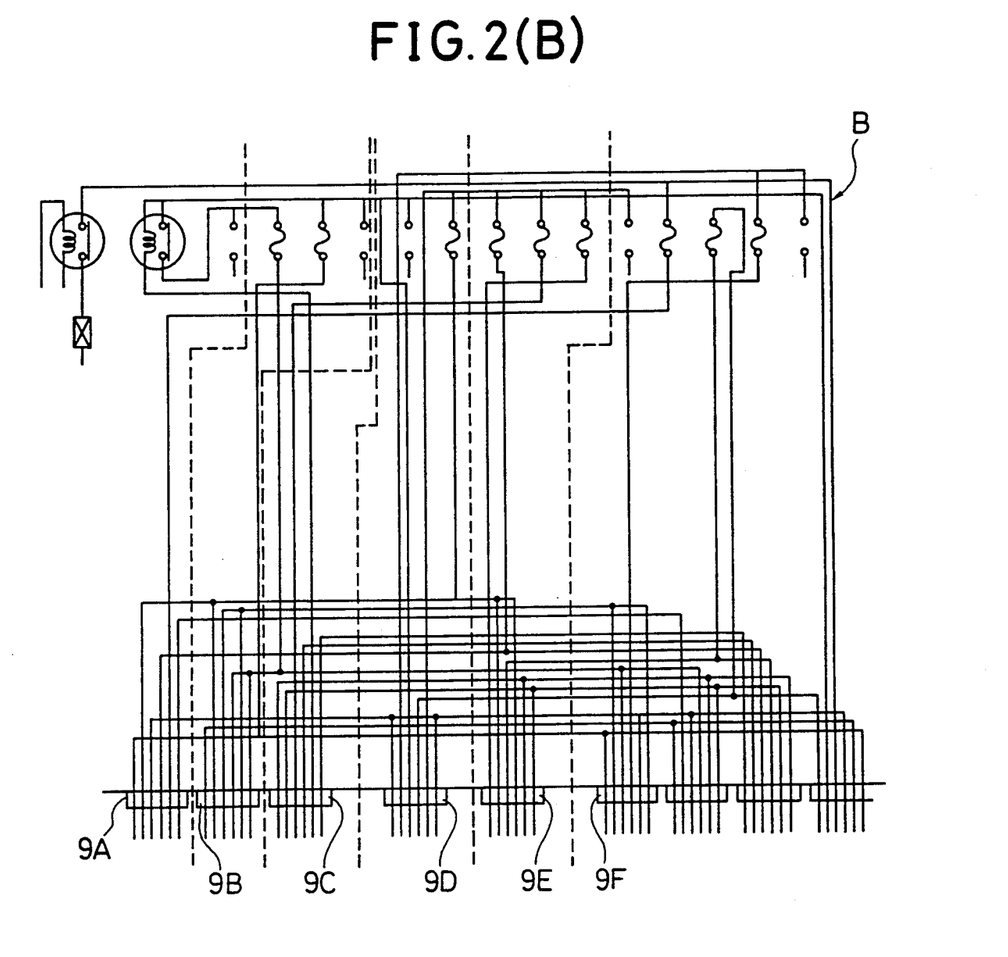
FIG. 2(B) is a wiring diagram of the internal circuit of the first embodiment of the electric junction box shown in FIG. 2(A)

FIG. 2(B) is a wiring diagram showing an internal circuit configuration of the electric junction box B shown in FIG. 1(A), by way of example. In FIG. 2(B), reference numerals 9A, 9B, 9C —denote connectors to which a plurality of subharness are connected. That is, the distributing unit assembly 20 shown in FIG. 2(A) is divided into plural stackable distributing units 21 so that the wires 22 on the same or different distributing unit 21 can be connected to each of these connectors 9A, 9B —, and further fuses and relays necessary for the circuits are provided, separately.

FIGS. 2(C)-1 to 2(C)-5 show various modifications of the interlayer connecting unit 28.

Figures 2C, 2C, 2C:
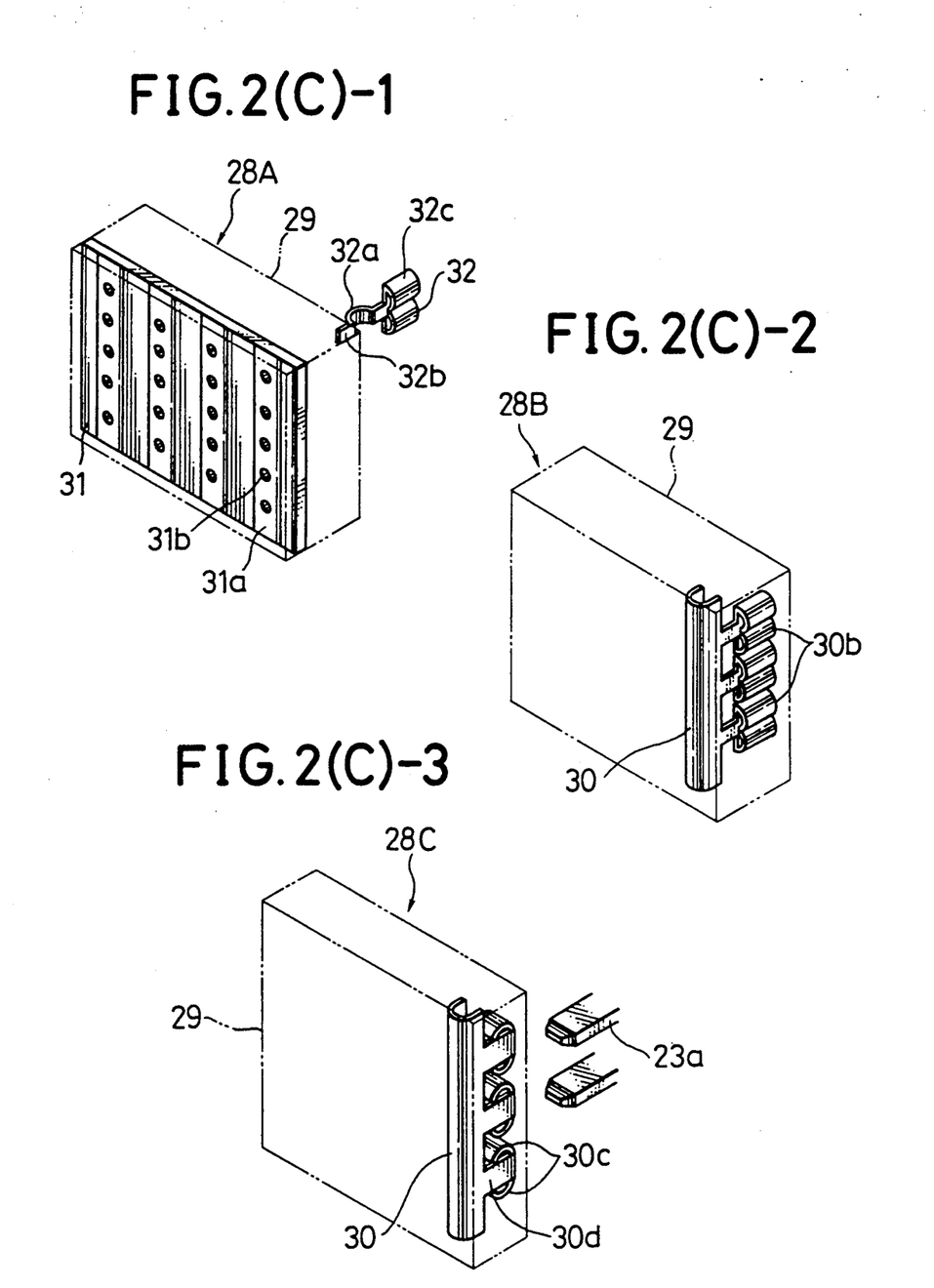
Figure 2C:
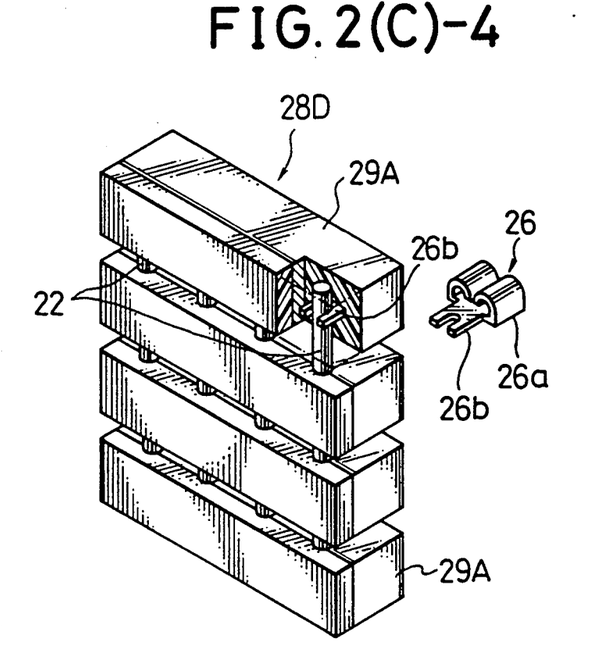
Figure 2C:
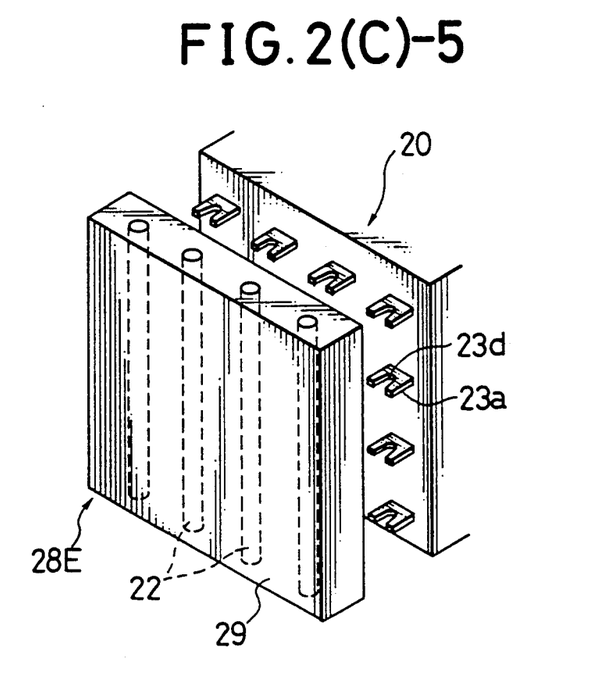

FIG. 2(C)-1 shows a first modification of the interlayer connecting unit 28A, in which a printed circuit board 31 having a plurality of conductive printed strips 31a formed with plural holes 31b is used instead of the interlayer shorting bar 30. A contact element 32 is used to connect the contact tab terminals 23a to the conductive printed strips 31a of the printed circuit board 31. In more detail, each contact element 32 is formed with two semicircular female tab holding portion 32c, a semicircular curved portion 32a and a male contact end tab portion 32b. Each contact element 32 is fixed to each printed strip 31a by inserting the male contact end tab portion 32b into each hole 31b formed in the printed strip 31a and soldering the top portion 32b to the printed strip 31a. The curved portion 32a serves to allow the female tab holding portion 32c to be adjustably moved horizontally in FIG. 2(C)-1 when the contact element 32 is connected to the contact tab terminal 23a of the wire shorting bus bars 23.

FIG. 2(C)-2 shows a second modification of the interlayer connecting unit 28B, in which a plurality of pairs of semicylindrical female tab holding portions 30b are formed integral with the interlayer shorting bar 30 instead of the slits 30a shown in FIG. 2(A).

FIG. 2(C)-3 shows a third modification of the interlayer connecting unit 28c, in which a pair of opposing semicylindrical female tab holding portions 30c are formed at each of projecting plates 30d of the shorting bar 30 instead of the two semicylindrical female tab holding portions 30b shown in FIG. 2(C)-2. Further, each contact tab terminal 23a is held between the two opposing tab holding portions 30c.

FIG. 2(C)-4 shows a fourth modification of the interlayer connecting unit 28D, in which a plurality of parallel arranged wire rods 22 are connected to a plurality of contact tabs 23a or 23b of the strip-shaped conductive shorting bus bar 23 each arranged on different distributing unit 21 via other contact elements 26. These wire rod 22 and contact elements 26 are molded together by plural insulating housings 29A and attached to at least one side end surface of the stackable distributing units 21. Each contact terminal 26 includes a pair of semicylindrical female tab holding portion 26a (nto which each contact tab 23a of the strip-shaped conductive shorting element 23 is inserted) and a flat portion 26b formed with a rod receiving open slot.

FIG. 2(C)-5 shows a fifth modification 28E of the interlayer connecting unit, in which a plurality of wire rods 22 are insertion molded in the housing 29 being arranged vertically at regular intervals and further the wire shorting bus bar 23 is formed with a contact top portion 23a with an open slot 23d brought into pressure contact with the wire rod 22.

As described above, in the electric junction box B according to the present invention as shown in FIG. 2(A), a plurality of wires 22 which constitute a subharness can be inserted, as they are, into the wire guide grooves 21a of each distributing unit 21₁, 21₂, —21₆ so as to be arranged in parallel to each other. Since no specific and complicated pattern is required, it is possible to simplify the wiring circuits within the junction box.

Further, although each wire shorting bus bar 23 or 23' is pressure connected to each different wire 22 arranged on each distributing unit 21₁, 21₂—21₆, separately, since each wire 22 is connected to each wire shorting bus bar 23 at right angles, respectively, the distributing units 21 are not connected to each other under these conditions. In other words, one wire 22 on one distributing unit 21 is connected to the other wire 22 on the other distributing unit 21 via only the interlayer connecting unit 28.

Therefore, it is possible to freely change the number of the distributing units 21 and the contact positions between the wires 22 and the shorting bus bars 23 and 23', independently without exerting any influence upon the wiring connection of the other distributing units. Further, in this connection, when the contact position between the wires 22 and the shorting bus bars 23 is changed or slid, it is possible to change the two distributing units 21 connected to each other via the interlayer connecting unit 28. As described above, the junction box according to the present invention can satisfy various interconnection requirements within the junction box without markedly changing the elements or parts, thus enhancing a standardization of the junction box.

Figure 3A:
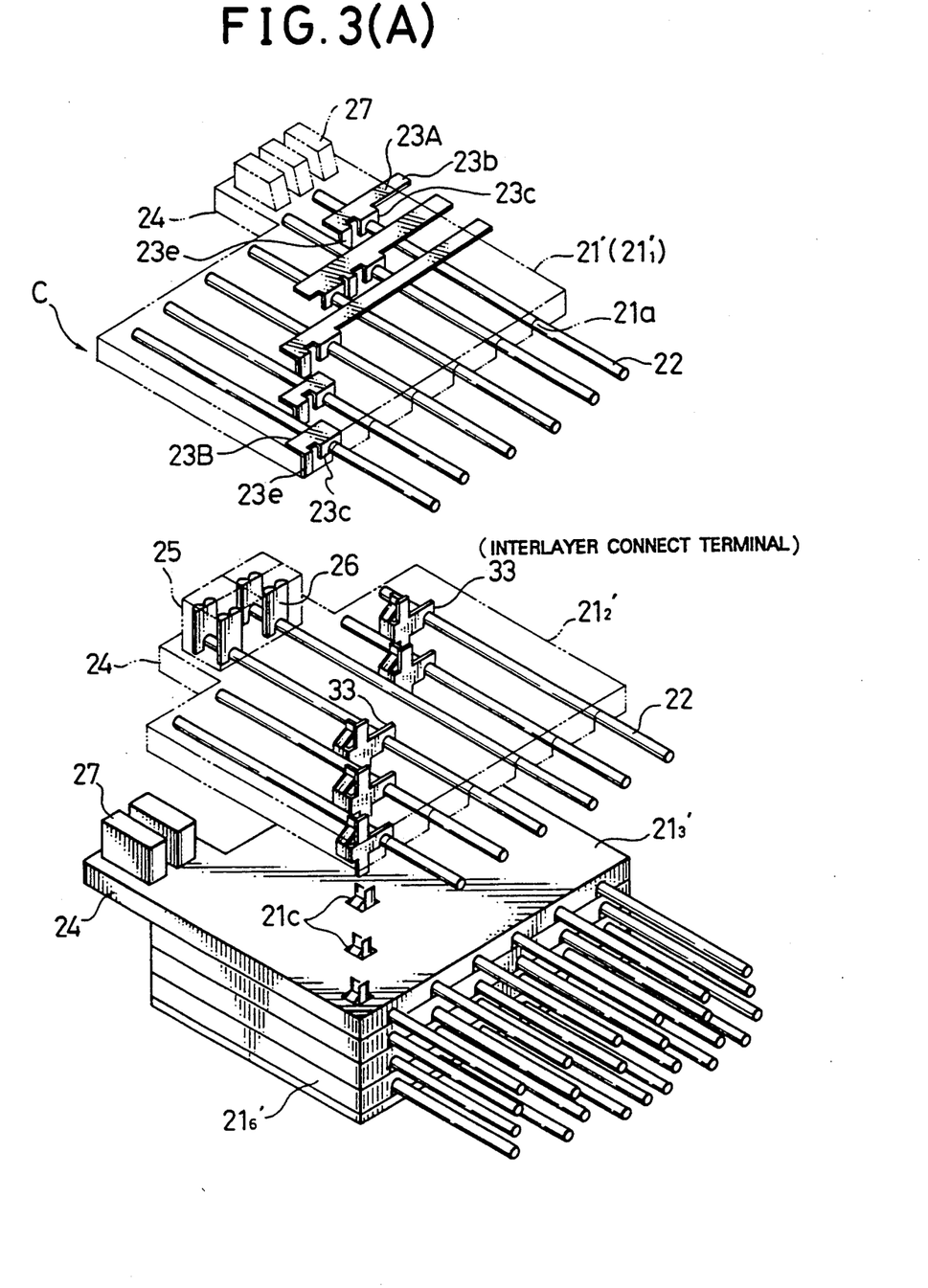
FIG. 3(A) is an exploded view showing the essential portions of a second embodiment of the electric junction box C according to the present invention.

FIG. 3(A), (B) and (C) show a second embodiment of the junction box C according to the present invention, which can eliminate the use of the interlayer connecting unit 28 shown in FIG. 2(A). That is, in FIG. 3(B), two wires 22c and 22d arranged on two adjacent (or different) distributing units are connected via an interlayer connecting terminal 33 passed through holes formed in the distributing units 21', that is, within the distributing unit assembly 20. In more detail, each distributing units $21_2'$, $21_3'$, —$21_6'$ (except the one $21_1'$) are formed with a plurality of interlayer connection holes 21c arranged along a diagonal line of the distributing unit in such a way that the interlayer connection holes 21c formed in the two adjacent distributing units match each other in position along each wire line.

Figures 3B, 3C:
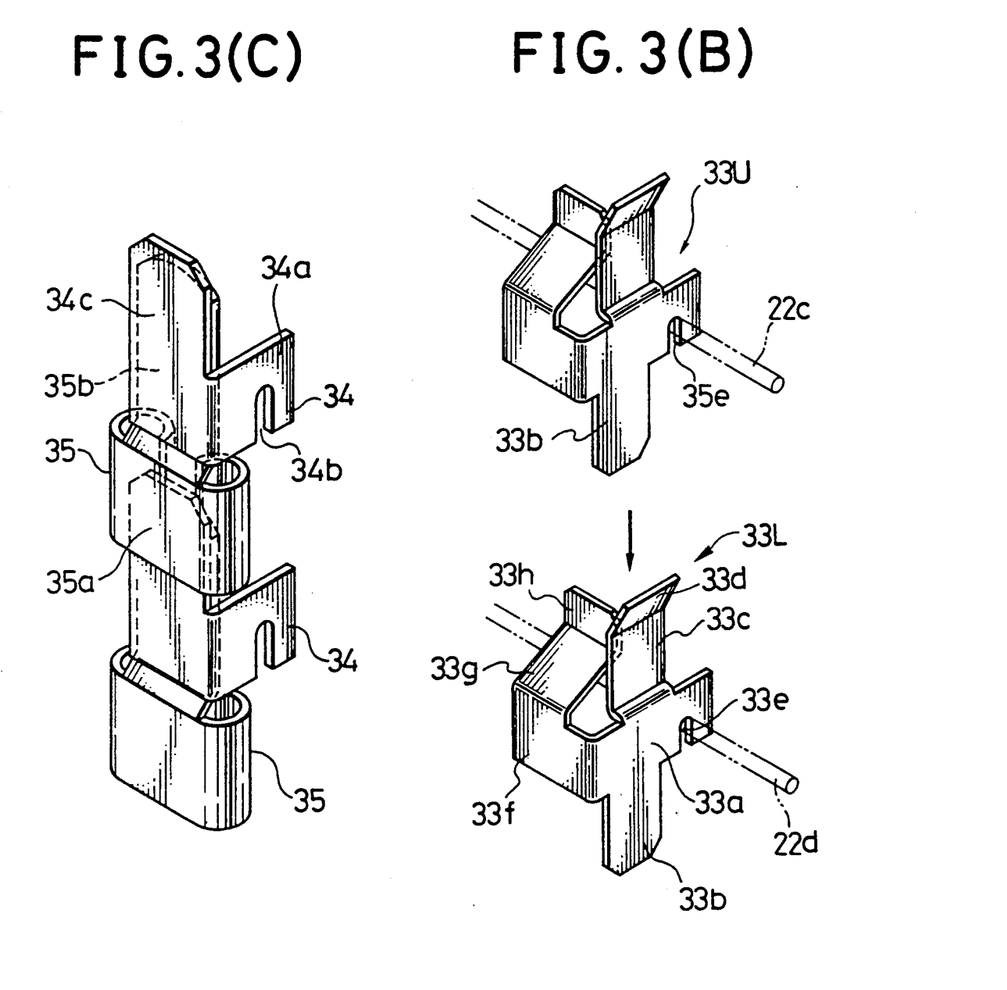
FIG. 3(B) is an enlarged perspective view showing a first modification of interlayer connecting terminals incorporated in the second embodiment shown in FIG. 3(A)
FIG. 3(C) is an enlarged perspective view showing a second modification of interlayer connecting terminals incorporated in the second embodiment shown in FIG. 3(A)

An example of the interlayer connecting terminal 33 is shown in FIG. 3(B), which is composed of an L-shaped base plate portion 33a formed with a downward opening wire receiving slot 33e, a downward extending straight tab portion 33b, an upward extending straight portion 33c formed with a sloped end 33d, an obliquely extending sloped portion 33g formed with a vertical end 33h in such a way as to be arranged perpendicular to the upward extending straight portion 33c. In FIG. 3(B), when the downward extending straight portion 33b of the upper side connecting terminal 33U is pushed down into pressure contact between the two straight and sloped portions 33c and 33g of the lower connecting terminal 33L via a hole 21c (shown in FIG. 3(A)), the upper side wire 22c fitted to the wire receiving slot 33e of the upper side connecting terminal 33U is connected to the lower side wire 22D fitted to the wire receiving slot 33e of the lower side connecting terminal 33L.

Further, in the case of the first uppermost distributing unit $21_1'$, wire shorting bus bars 23A and 23B are used to connect the wires 22 arranged on the first distributing unit $21_1'$ with other wires 22 arranged on the second distributing unit $21_2'$ via downward extending tabs 23c of the shorting bus bars 23A and 23B, instead of the interlayer connecting terminal 33. In more detail, the wire shorting bus bar 23A similar to that 23 shown in FIG. 2(A) in structure is formed with a horizontal tab terminal 23b, a downward extending contact tab portion 23c formed with a wire receiving open slot for a wire 22, and a downward extending straight tab portion 23e connectable between the two straight and sloped portions 33c and 33g of the lower connecting terminal 33L in the same way as in FIG. 3(B). The wire shorting bus bar 23B is also formed with a downward extending contact tab portion 23c formed with a wire receiving slot for a wire and a downward extending straight tab portion 23e connectable with the interlayer connecting terminal 33.

FIG. 3C shows another example of the interlayer connecting terminal 34, which is formed with an L-shaped base plate portion 34a formed with a downward opening wire receiving slot 34b and an upward extending straight plate portion 34c. These two interlayer connecting terminals 34 are connected via an intermediate terminal 35 also shown in FIG. 3(C), which is formed with a pair of semicylindrical female tab holding portion 35a and an upward extending straight plate portion 35b contactable with the surface of the upward extending straight plate portion 34c of the interlayer connecting terminal 34 as shown. In this modification, it is possible to connect two distributing units by use of two interlayer connecting terminals 34 (which is simple in structure as compared with that 33 shown in FIG. 3(B)) and an intermediate terminal 35.

The junction box C shown in FIG. 3(A) can be formed by stacking each distributing unit $21_1'$, $21_2'$, —$21_6'$ in order and by interconnecting the wires 22 arranged on different distributing units with the interlayer connecting terminals 33 passed through the interlayer connecting holes 21c formed in the distributing units 21'.

Figure 4A:
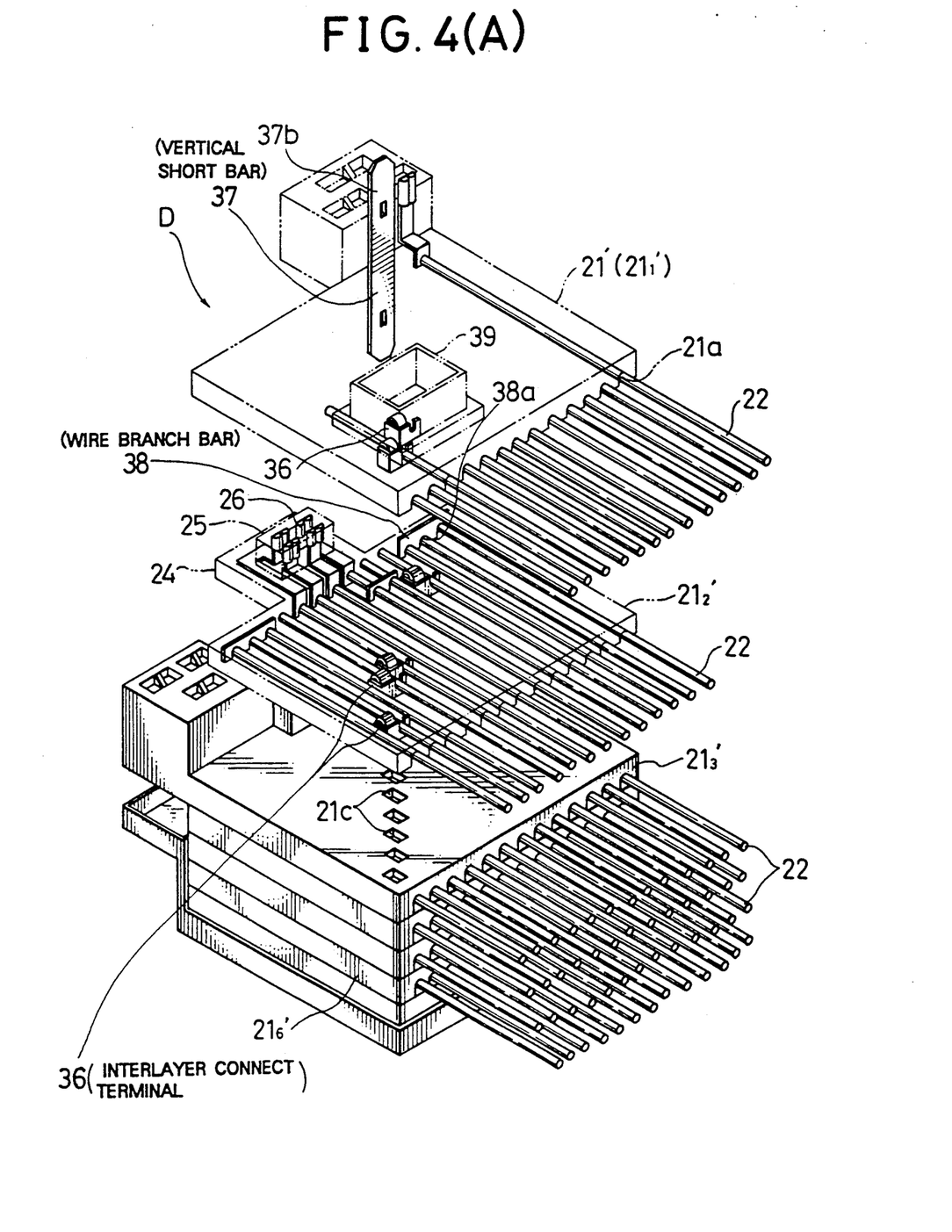
FIG. 4(A) is an exploded view showing the essential portions of a third embodiment of the electric junction box D according to the present invention.

Further, the wires 22 arranged on the same distributing unit can be connected by use of wire branch bars as shown in FIG. 4(A) in place of the wire shorting bus bar 23 shown in FIG. 2(A).

This junction box C can construct almost the same wiring circuit as the junction box B shown in FIG. 2(A) without use of any interlayer connecting unit 28A, 28B, 28C, 28D or 28E shown in FIGS. 2(C)-1 to FIG. 2(C)-5. Since a number of wire shorting bus bars 23 and 23' are unnecessary, it is possible to minimize the size and the number of parts of the junction box, thus allowing a lower parts cost and shorter assembly time.

Figure 4B:
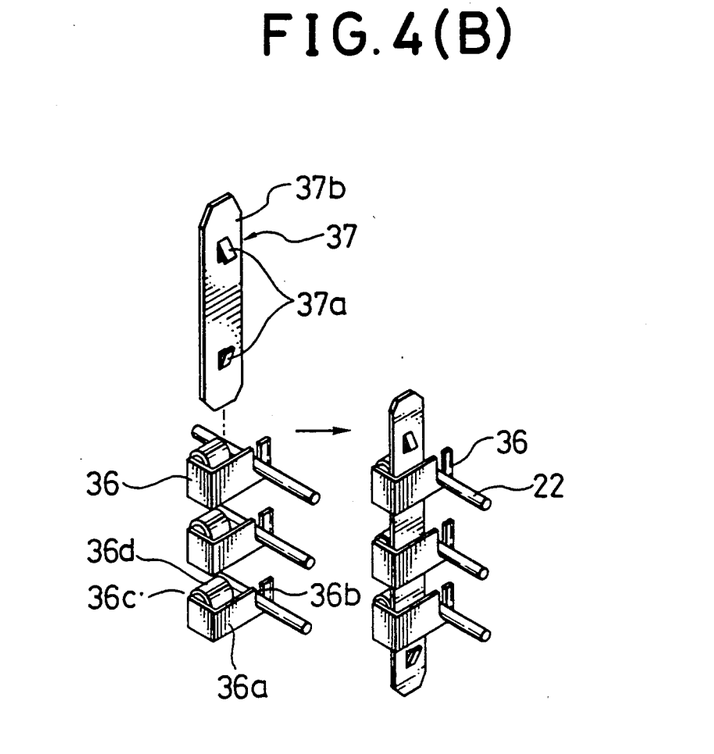
FIG. 4(B) is an enlarged perspective view showing interlayer connecting terminals and a vertical shorting bar incorporated in the third embodiment shown in FIG. 4(A)

FIGS. 4(A) and 4(B) a third embodiment of the junction box C according to the present invention, in which wires arranged on one distributing unit are connected to wires arranged on the other distributing unit by another interlayer connecting terminal 36 and a vertical shorting bar 37 without use of the interlayer connecting unit 28 shown in FIG. 2(A). Further, the wires 22 arranged on the same distributing unit can be connected to each other for by use of wire branch bars 38.

As shown in FIG. 4(B), the interlayer connecting terminal 36 is formed with an U-shaped base plate portion 36a having one straight portion formed with an upward opening wire receiving slot 36b, and the other straight portion 36c formed with an elastic semicylindrical bar holding portion 36d. Each of these interlayer connecting terminal 36 is positioned at each interlayer connecting hole 21c formed in each distributing unit $21_1'$, $21_2'$—$26_6'$, and each wire 22 is pressure fitted to the upward opening wire receiving slot 36b of the interlayer connecting terminal 36. Under these conditions, a vertically straight shorting bar 37 is inserted between the one flat side of the U-shaped base plate portion 36a and the semicylindrical bar holding portion 36d to interconnect the distributing units. Further, it is preferable that the vertical shorting bar 37 is formed with two opposing claws 37a to prevent the interlayer connecting terminals 36 from being moved or removed.

In addition, one or both ends of each vertical shorting bar 37 can be used as tabs 37b connectable to external elements. For instance, as shown in FIG. 4(A), when a connector housing 39 is formed on the first distributing unit $21_1'$ and further the tab 37b of the vertical shorting bar 37 is passed through an interlayer connecting hole formed within the connector housing 39, it is possible to connect another connector of another external subharness different from the group of the wires 22.

Further, when the wires 22 arranged on the same distributing unit 21' are required to be connected to each other, a wire branch bar 38 formed with a plurality of wire receiving open slots 38a through which the wires 22 are pressure fitted is attached. The positions and the number of the open slots 38a can be selected freely for providing any given branch connections, without use of any wire shorting bus bar 23 as shown in FIG. 2(A).

Figure 5A:
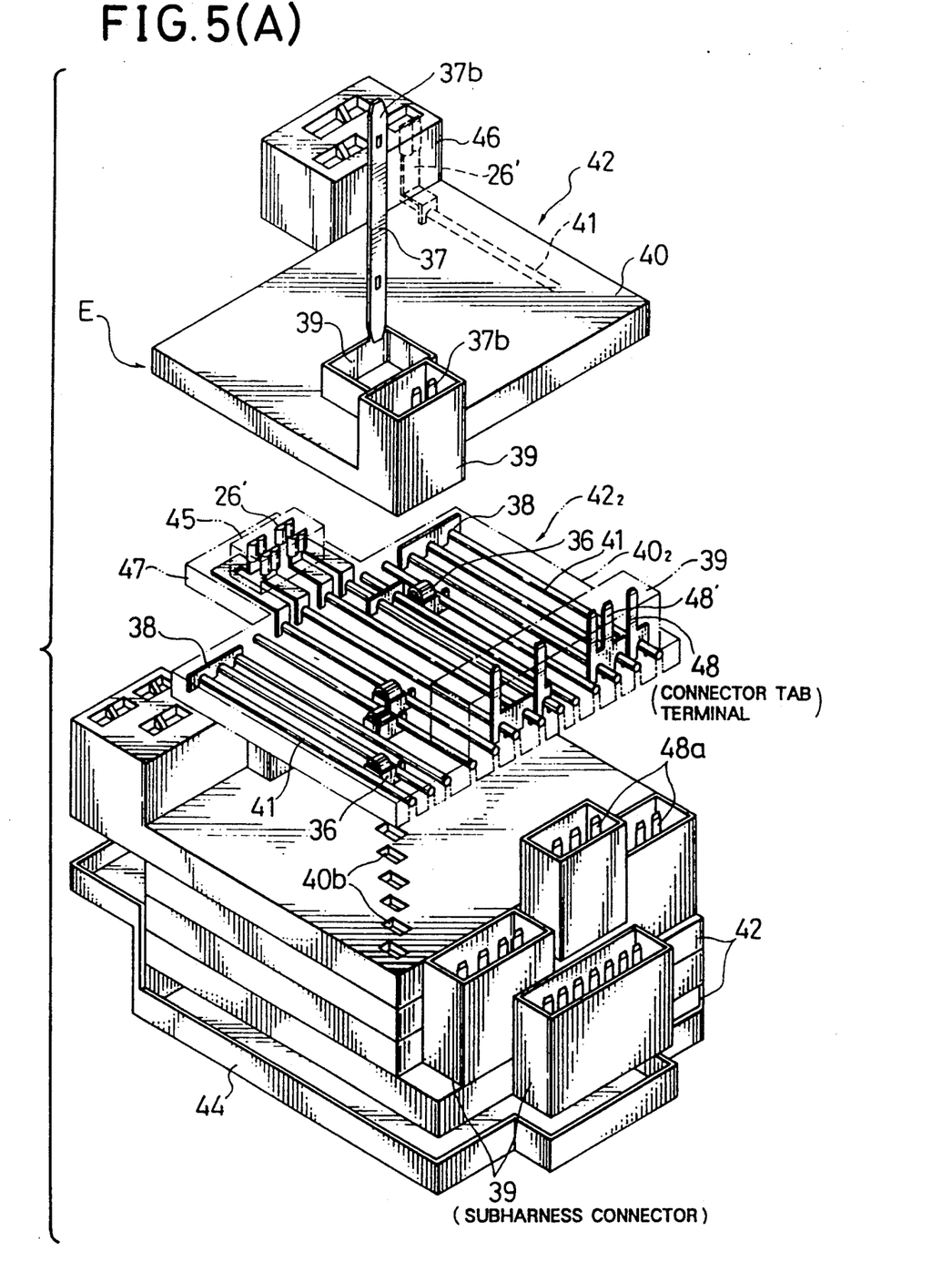
FIG. 5(A) is an exploded view showing the essential portions of a fourth embodiment of the electric junction box E according to the present invention.

FIG. 5(A) shows a fourth embodiment of the junction box E according to the present invention, in which a plurality of distributing base assembly 42 each provided with at least one subharness connector 39 and plural wires 41 arranged on an insulating board 40 are stacked one upon the other. Further, in FIG. 5(A), these distributing board assemblies are sandwiched between an upper insulating cover 40 and a lower insulating cover 44. Further, where necessary, a fuse connector 45 and a relay connector 46 can be provided on each distributing board assembly 42.

Figure 5B:
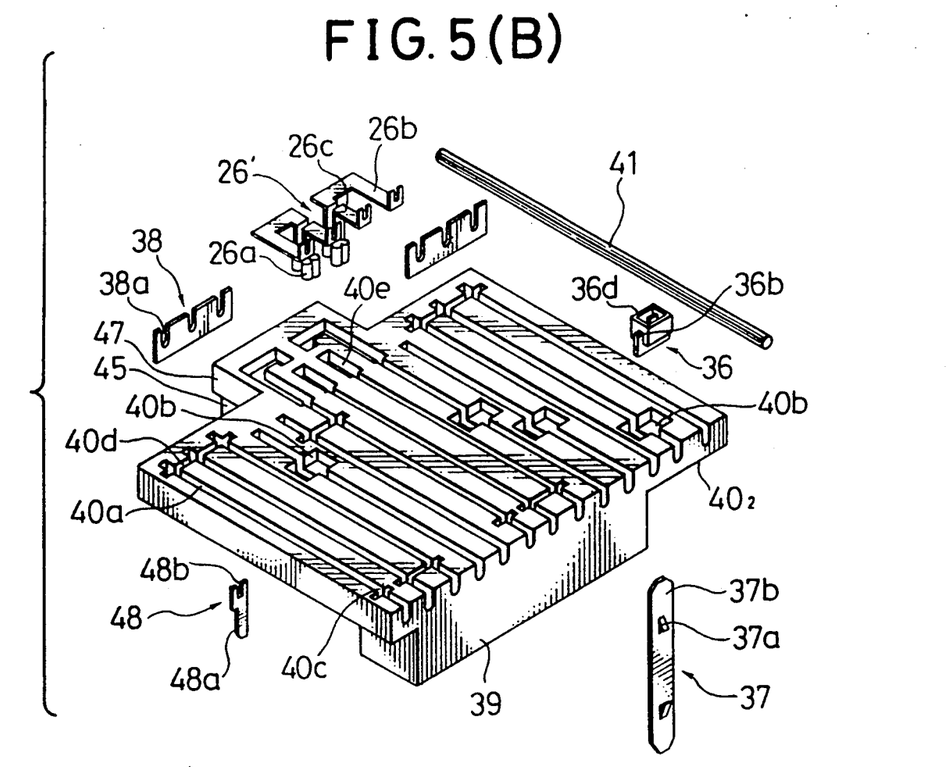
FIG. 5(B) is an exploded view showing the same fourth embodiment of the electric junction box E when the stackable distributing unit is seen from the bottom thereof.

FIG. 5(B) shows a lower surface of the second layer insulating board $40_2$ shown in FIG. 5(A), in which a plurality of wire arrangement grooves 40a are formed at regular intervals in parallel to each other. Further, plural interlayer connecting holes 40b are formed along a diagonal line of the board; connector tab insertion slots 40c are formed near both side end surfaces; and wire branch bar fitting grooves 40d and fuse or relay terminal insertion holes 40e into which fuse or relay contact terminals are fitted are also formed.

These interlayer connecting hole 40b and the wire branch bar fitting grooves 40d (shown in FIG. 5(B)) are formed crossing any given lines of the wire arrangement grooves 40a. The fuse or relay terminal insertion holes 40e are formed at each end of the wire arrangement grooves 40a. The connector tab insertion holes 40c communicate with a cavity of the external subharness connector 39 provided on the second insulating board $40_2$, and the fuse or relay terminal insertion holes 40e communicate with a cavity of the fuse or relay connector 45 provided on the projection portion 47 of the second insulating board $40_2$.

The second layer distributing board assembly $42_2$ can be assembled as follows:

(a) The interlayer connecting terminals 36 are inserted into the interlayer connection holes 40b formed in the second layer insulating board $40_2$.

(b) One- or two-pole male subharness connector tab terminals 48 and 48' are inserted into the tab insertion hole 40c so as to project vertically into the subharness connector 39.

(c) The wire branch bars 38 are fitted and fixed to the branch bar insertion grooves 40d.

(d) The female fuse or relay contact terminals 26' are inserted into the fuse or relay terminal insertion holes 40e.

(e) The wires 41 cut into a predetermined length are arrangement on the wire arrangement grooves 40a so as to be pressure connected to into each open wire receiving slot 36b, 48b, 38a and 26b of the interlayer connecting terminals 36, the male subharness connector tab terminals 48 and 48', the wire branch bars 38, and the fuse or relay contact terminals 26'.

The distributing board assembly $42_2$ is provided with the subharness connector 39 to which the subharness can be connected immediately. The number of the connector tab terminals 48 is determined so as to correspond to the number of female terminals of the external subharness connector. Further, when the number of the connector tab terminal 48 is small on the same distributing board assembly, it is possible to mount two or more subharness connectors 39 on the same distributing board assembly.

Further, when the subharness connected to the distributing board assembly $42_2$ includes a fuse circuit or a relay circuit, a fuse connector 45 or a relay connector 46 are also arranged in addition to the subharness connector 39.

As described above, after the distribution board assembly 42 has been assembled, a plurality of assemblies 42 are stacked as shown in FIG. 5(A); the vertical shorting bars 37 are inserted vertically through the interlayer connection holes 40b; the interlayer connecting terminals 36 are attached between the two adjacent wires in the same way as in FIG. 4(B) for providing necessary interlayer connections.

Further, at the final assembly process, the lower cover board 44 is attached, and all the stacked boards are fixed together to obtain the electric junction box E.

The junction box E as described above has the following features or advantages:

(1) Since each distributing board assembly 42 or each insulating board 40 is provided with at least one subharness connecting connector 39, a plurality of subharness can be connected to the junction box so as to be stacked in the vertical direction.

(2) Since the wires 41 of each distributing board assembly 42 are directly connected to the subharness via the subharness connector 39, being different from the other junction boxes from B to D, it is possible to assemble the junction box, according to the wire harness or subharness.

(3) When each vertical shorting bar 37 is removed from the distributing board assemblies 42, it is possible to disable electric and mechanical relationship between these distributing board assemblies 42. Therefore, it is possible to freely increase or decrease the number of the distributing board assemblies 42 or to freely modify the internal circuit configuration according to the necessity, without exerting harmful influence upon the other assemblies 42.

(4) Since the bus bars 4 can be also usable as in the prior-art junction box (shown in FIG. 1(A)), in place of the wires 41, by using branch tabs 5 having the same vertical length, it is possible to eliminate complicated work such that the vertical shorting bars 37 are passed through the other insulating board 40.

Figure 6:
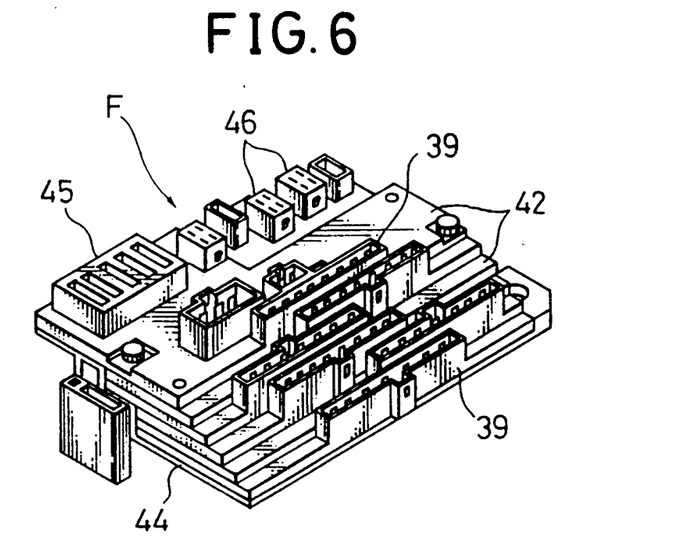
FIG. 6 is a perspective view showing a fifth embodiment of the electric junction box F according to the present invention.

FIG. 6 shows a fifth embodiment of the junction box F according to the present invention, in which when a plurality of the distributing board assemblies 42 are stacked, the subharness connectors 39 attached to the assemblies 42, separately are arranged in tiers. A set of subharness is connected to each connector 39, as explained above.

As described above, in the electric junction box according to the present invention, since the internal circuits on the stackable distributing units or boards are divided into a plurality of units so as to be connected to the subharness via the subharness connectors, independently, it is possible to simplify and standardize the circuit pattern on the distributing units or boards, so as to be modified according to the necessity or requirements, for instance, in accordance with the models of automotive vehicles.

What is claimed is:

1. An electric junction box, comprising:
    (a) a plurality of stackable distributing units having end surfaces, each distributing unit including a plurality of parallel arranged wires connectable with at least one external subharness;
    (b) wire shorting means arranged on each respective distributing unit so as to cross said parallel arranged wires, each wire shorting means being connected to at least one of said parallel arranged wires arranged on said same distributing unit; and
    (c) interlayer connecting means, arranged so as to cross surface of said distributing units, for connecting said wires and said wire shorting means arranged on different distributing units.

2. The electric junction box of claim 1, wherein said interlayer connecting means is an interlayer connecting terminal having an L-shaped base plate portion formed with a downward opening wire receiving slot, a straight plate portion extending upward from said base portion, a sloped plate portion extending obliquely upward from said base portion at right angles with respect to said straight plate portion, and a straight tab portion extending downward from said base portion so as to be engageable between said straight plate portion and said sloped portion of another adjacent interlayer connecting terminal, said straight tab portion of said interlayer connecting terminals being passed through holes formed in said stackable distributing units.

3. The electric junction box of claim 1, wherein said interlayer connecting means is an interlayer connecting terminal having an L-shaped base plate portion formed with a downward opening wire receiving slot and a straight plate portion extending upward from said base portion at right angles with respect to said wire receiving slot, said interlayer connecting terminal being connected to another adjacent interlayer connecting terminal via an intermediate terminal formed with a pair of semicylindrical female tab holding portions into which said straight plate portion of another interlayer connecting terminal is inserted and an upward extending straight plate portion, said intermediate terminals being passed through holes formed in said stackable distributing units.

4. The electric junction box of claim 1, wherein said interlayer connecting means is an interlayer connecting terminal including a U-shaped base portion having one straight portion formed with an upward opening wire receiving slot and another straight portion formed with an elastic semicylindrical bar holding portion, said interlayer connecting terminal being connected to another adjacent interlayer connecting terminal via a vertical shorting bar formed with two opposingly sloped claws projecting from a surface of said vertical shorting bar, said vertical shorting bar being passed through holes formed in said stackable distributing units.

5. The electric junction box of claim 1, wherein said wire shorting means is a wire branch bar (38) formed with a plurality of wire receiving open slots(38a), for directly shorting the wires arranged on the same distributing unit (21).

6. The electric junction box of claim 1, which further comprises at least one fuse box mounted on at least one of said distributing units and connected between two wires arranged on the same distributing unit.

7. The electric junction box of claim 1, which further comprises at least one relay mounted on at least one of said distributing units and connected between two wires arranged on the same distributing unit.

8. The electric junction box of claim 1, wherein said wire shorting means is a wire shorting bus bar having a strip-shaped conductive shorting bar element formed with at least one contact tab terminal, at least one end thereof and at least one wire contact portion thereof being formed with a wire receiving open slot.

9. The electric junction box of claim 8, wherein said interlayer connecting means is an interlayer connecting unit including a plurality of parallel arranged wire rods connected to an open slot of each contact tab of said strip-shaped conductive shorting bar element arranged on a different distributing unit, said rods being arranged within an insulating housing and attached to at least one side end surface of said stackable distributing unit.

10. The electric junction box of claim 8, wherein said interlayer connecting means is an interlayer connecting unit including a printed circuit board having a plurality of conductive printed strips formed with plural holes into which a plurality of contact tabs of said strip-shaped conductive shorting bar elements each arranged on different distributing unit are inserted via a contact element, said printed circuit board being housed with an insulating housing and attached to at least one side end surface of said stackable distributing units.

11. The electric junction box of claim 10, wherein said contact element comprises:
(a) a contact end tab portion passed through the holes of said conductive printed strip and soldered thereto;
(b) a pair of semicylindrical female tab holding portions into which each contact tab of said strip-shaped conductive shorting bar element is inserted; and
(c) a curved portion connected between said contact end tab portion and said pair of female tab holding portions.

12. The electric junction box of claim 8, wherein said interlayer connecting means is an interlayer connecting unit including a plurality of U-shaped section semicylindrical shorting bars each formed with plural tab insertion slits into which a plurality of contact tabs of said strip-shaped conductive shorting bar elements each arranged on said different distributing unit are inserted, said plural U-shaped section semicylindrical shorting bars being arranged within an insulating housing and attached to at least one side end surface of said stackable distributing units.

13. The electric junction box of claim 12, wherein a plurality of said U-shaped section semicylindrical shorting bars are each formed with a pair of semicylindrical female tab holding portions which a plurality of contact tabs of said strip-shaped conductive shorting bar elements each arranged on said different distributing unit are inserted.

14. The electric junction box of claim 8, wherein said interlayer connecting means is an interlayer connecting unit including a plurality of parallel arranged wire rods connected to a plurality of contact tabs of said strip-shaped conductive shorting bar elements, each arranged on a different distributing unit via other contact elements, said rods and said contact elements being molded together by a plurality of separated insulating housings and attached to at least one side end surface of said stackable distributing units.

15. The electric junction box of claim 14, wherein said contact element comprises:
(a) a pair of semicylindrical female tab holding portions into which each contact tab of said strip-shaped conductive shorting bar element is inserted; and
(b) a flat portion formed with a rod receiving open slot.

16. The electric junction box of claim 1, which further comprises at least one male connector terminal (48) formed with at least one wire receiving slot and at least one tab portion extending perpendicular to a surface of said distributing unit so as to constitute a male contact terminal of a subharness connector (39).

17. The electric junction box of claim 16, which further comprises at least one subharness connector (39) arranged on each distributing unit, for connecting said parallel arranged wires on said distributing unit with the at least one external subharness.

18. The electric junction box of claim 17, wherein said subharness connectors connected to said wires on said plural distributing units are mounted on said distributing units, respectively in tiers.

* * * * *